United States Patent
Filippov et al.

(10) Patent No.: US 10,145,220 B2
(45) Date of Patent: Dec. 4, 2018

(54) INFLOW CONTROL APPARATUS, METHODS, AND SYSTEMS

(71) Applicant: Landmark Graphics Corporation, Houston, TX (US)

(72) Inventors: Andrey Filippov, Houston, TX (US); Vitaly Khoriakov, Calgary (CA)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 372 days.

(21) Appl. No.: 14/781,685

(22) PCT Filed: Oct. 24, 2014

(86) PCT No.: PCT/US2014/062213
§ 371 (c)(1),
(2) Date: Oct. 1, 2015

(87) PCT Pub. No.: WO2016/064420
PCT Pub. Date: Apr. 28, 2016

(65) Prior Publication Data
US 2016/0298429 A1    Oct. 13, 2016

(51) Int. Cl.
*E21B 43/08* (2006.01)
*E21B 43/12* (2006.01)
*E21B 47/12* (2012.01)
*G05B 19/416* (2006.01)
*G06F 17/50* (2006.01)

(52) U.S. Cl.
CPC ............ *E21B 43/08* (2013.01); *E21B 43/082* (2013.01); *E21B 43/12* (2013.01); *E21B 47/124* (2013.01); *G05B 19/416* (2013.01); *G06F 17/5009* (2013.01); *G05B 2219/37371* (2013.01)

(58) Field of Classification Search
None
See application file for complete search history.

(56) References Cited

U.S. PATENT DOCUMENTS 6,450,345 B1 * 9/2002 Adams ................. B01D 29/012
156/210
7,380,564 B2    6/2008 Lull et al.
(Continued)

FOREIGN PATENT DOCUMENTS

| JP | 2010-015580 A | 1/2010 |
| WO | WO-2010015580 A1 | 2/2010 |
| WO | WO-2016/064420 A1 | 4/2016 |

OTHER PUBLICATIONS

"International Application Serial No. PCT/US2014/062213, International Search Report dated Jul. 24, 2015", 3 pgs.
(Continued)

*Primary Examiner* — Tuan C Dao

(57) ABSTRACT

In some embodiments, a simulation apparatus may comprise a processor and a memory to store a set of instructions, which when executed by the processor, forms a machine programmed to generate an analytical solution to simulate multiple scenarios for a total fluid flow rate in order to find one of the scenarios that meets a desired total flow rate for a fluid flow entering a portion of a screen to pass through one or more orifices in a base conduit covered by the screen. Additional apparatus, systems, and methods are described.

10 Claims, 7 Drawing Sheets

(56) References Cited

U.S. PATENT DOCUMENTS

| | | | |
|---|---|---|---|
| 2005/0216242 A1* | 9/2005 | Flax | A62C 35/62 |
| | | | 703/9 |
| 2008/0149203 A1 | 6/2008 | Atkinson et al. | |
| 2008/0237141 A1* | 10/2008 | Kerfoot | C02F 9/00 |
| | | | 210/739 |
| 2009/0000787 A1 | 1/2009 | Hill et al. | |
| 2011/0011595 A1* | 1/2011 | Huang | E21B 43/00 |
| | | | 166/369 |
| 2011/0226469 A1 | 9/2011 | Lovell et al. | |
| 2012/0325472 A1* | 12/2012 | Litvinets | C09K 8/665 |
| | | | 166/280.1 |
| 2014/0122035 A1 | 5/2014 | Dean et al. | |

OTHER PUBLICATIONS

"International Application Serial No. PCT/US2014/062213, Written Opinion dated Jul. 24, 2015", 5 pgs.
Byrne, M., et al., "Complex completion design and inflow prediction enabled by detailed numerical wall modeling", SPE 168149, SPE International Symposium and Exhibition on Formation Damage Control, Feb. 26-28, Lafayette, Louisiana, USA, (2014), 24 pgs.
Moen, T., et al., "Inflow control devices and near-wellbore interactions", SPE 112471, SPE International Symposium and Exhibition on Formation Damage Control, Feb. 13-15, Lafayette, Louisiana, USA, (2008).
"French Application Serial No. 1558414, Office Action dated Mar. 31, 2016", (w/ English Summary), 6 pgs.
"French Application Serial No. 1558414, Response filed May 13, 2016 to Office Action dated Mar. 31, 2016", (w/English Translation of Claims), 75 pgs.

* cited by examiner

INFLOW CONTROL APPARATUS, METHODS, AND SYSTEMS

PRIORITY APPLICATION

This application is a U.S. National Stage Filing under 35 U.S.C. 371 from International Application No. PCT/US2014/062213, filed 24 Oct. 2014; which application is incorporated herein by reference in its entirety.

BACKGROUND

Horizontal wells formed in geological formations have become common, and constitute an architecture that is widely applied in the field. However, due to frictional pressure drops and reservoir permeability variations along the length of the well, the fluid flux can vary considerably, with higher injection and production flow rates typically at the heel.

Inflow Control Devices (ICD) have been used for years regulate flow rates by creating an additional pressure drop between the reservoir and the well. To improve the efficiency and longevity of ICD operation, their design should account for the fluid flow conditions in the vicinity of the wellbore, such as non-uniform pressure distribution. However, because the flow pattern around an ICD is complex, it has been noted in the industry that traditional approaches, those that make use of numerical modeling, or assuming an even inflow pressure along the whole completion length are often not accurate enough to satisfy the needs of commercial production, especially when annulus between the device and the formation is filled with sand.

DETAILED DESCRIPTION

To address some of the challenges described above, as well as others, apparatus, systems, and methods are described herein that may operate to increase the operational efficiency of devices used to predict the pressure and flow profile of fluids moving in the vicinity of ICDs. In this way, ICD design can take into account the conditions, such as flow rates, viscosities, etc. that are expected in a particular well, and the results of flow simulations can be available much more quickly than is possible with conventional approaches, to provide more immediate guidance with respect to ICD component design.

In one embodiment, a method for simulating fluid flow in the vicinity of an ICD is disclosed. An analytical solution of the pressure and flow field near the ICD section of the wellbore, with smooth predictions of the non-uniform axial pressure distribution as distance from the wellbore increases, is used. As will be demonstrated below, the results obtained using the analytical solution are very close to those provided by much more computationally intense numerical simulations, such as those using the Finite Difference Method.

For example, when ICDs are chosen for use in a particular well location, the methods described herein can operate to combine flow through the device with the flow in the porous media surrounding the device, to optimize ICD screen parameters. Thus, in some embodiments, the screen area and gap height between the screen and the base conduit can be selected relatively quickly, reducing development cost and the risk of improperly-sized device deployment as the same time. This provides an overall improvement in the modeling of ICD performance via numerical simulators that are commonly used by petroleum engineers.

In some embodiments, the analytical expressions for pressure/flow field around the ICD that are developed herein can be included in conventional numerical simulators, such as those that operate as part of the NETool™, QuickLook®, and Nexus® software packages, among others. As a result the speed of completion modeling can be dramatically improved. Various example embodiments that can provide some or all of these advantages will now be described in detail.

Figure 1:
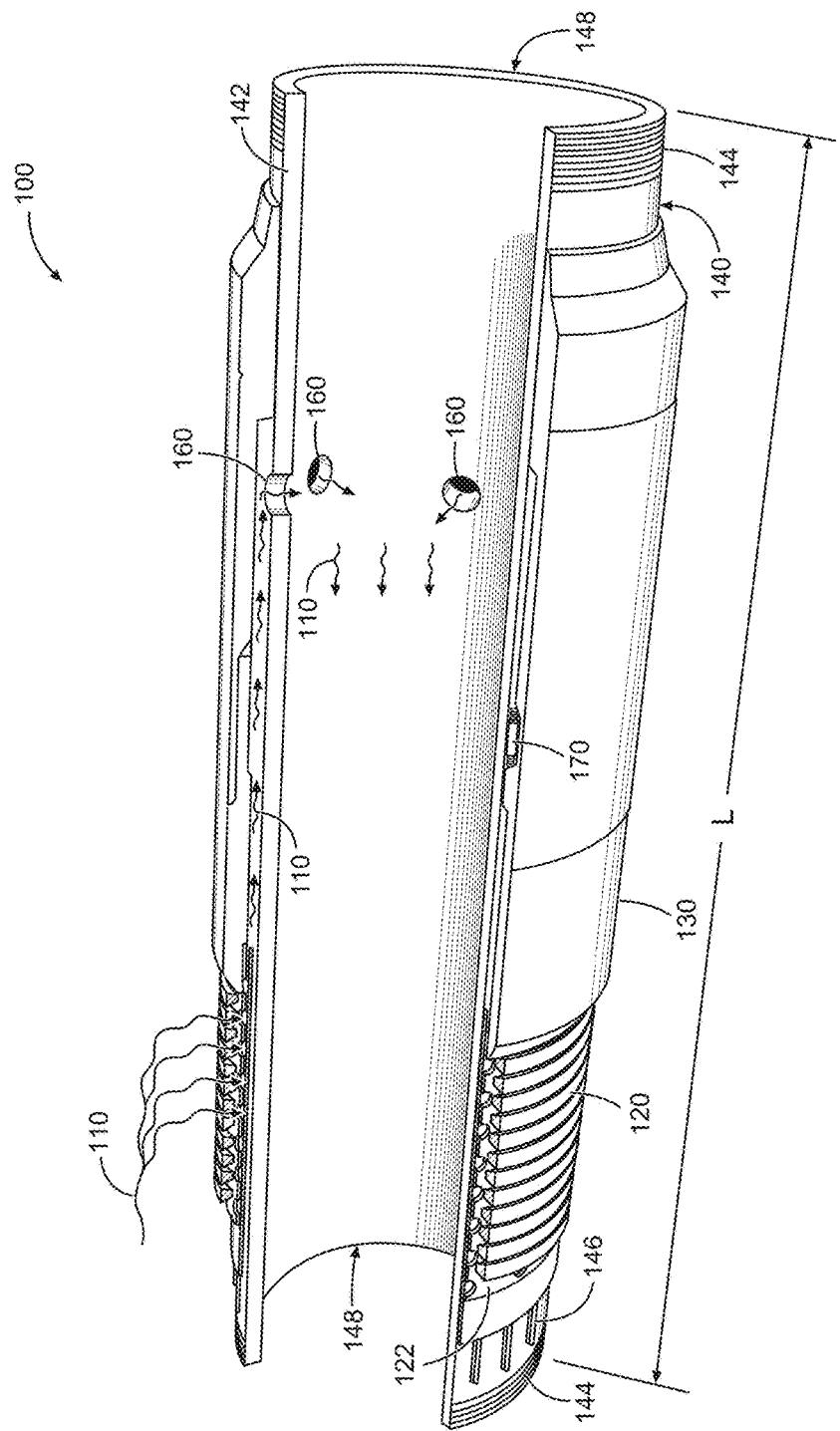
FIG. 1 is a side, cut-away view of an apparatus according to various embodiments of the invention.

FIG. 1 is a side, cut-away view of an apparatus 100 according to various embodiments of the invention. In some embodiments, the apparatus 100 comprises an ICD.

In some embodiments, the apparatus 100 is manufactured using a base conduit 140 having a length L=12 m. Formation fluids 110 in the wellbore surrounding the apparatus 100 can enter the interior of the base conduit 140 only through a small portion of the surface of the apparatus 100—the portion that is covered by a screen 120 (often supported by a screen substrate 122), such as a sand screen, and thereafter, through a set of downstream orifices 160. The outer surface of the apparatus 100 that is not covered by the screen 120 may comprise a shroud 130 and the base conduit 140, which are both substantially impenetrable to the fluids 110 (except for the orifices 160 in the base conduit 140). The base conduit 140 may have threads or other coupling mechanisms 144 located proximate to each of the end ports 148.

Figure 8:
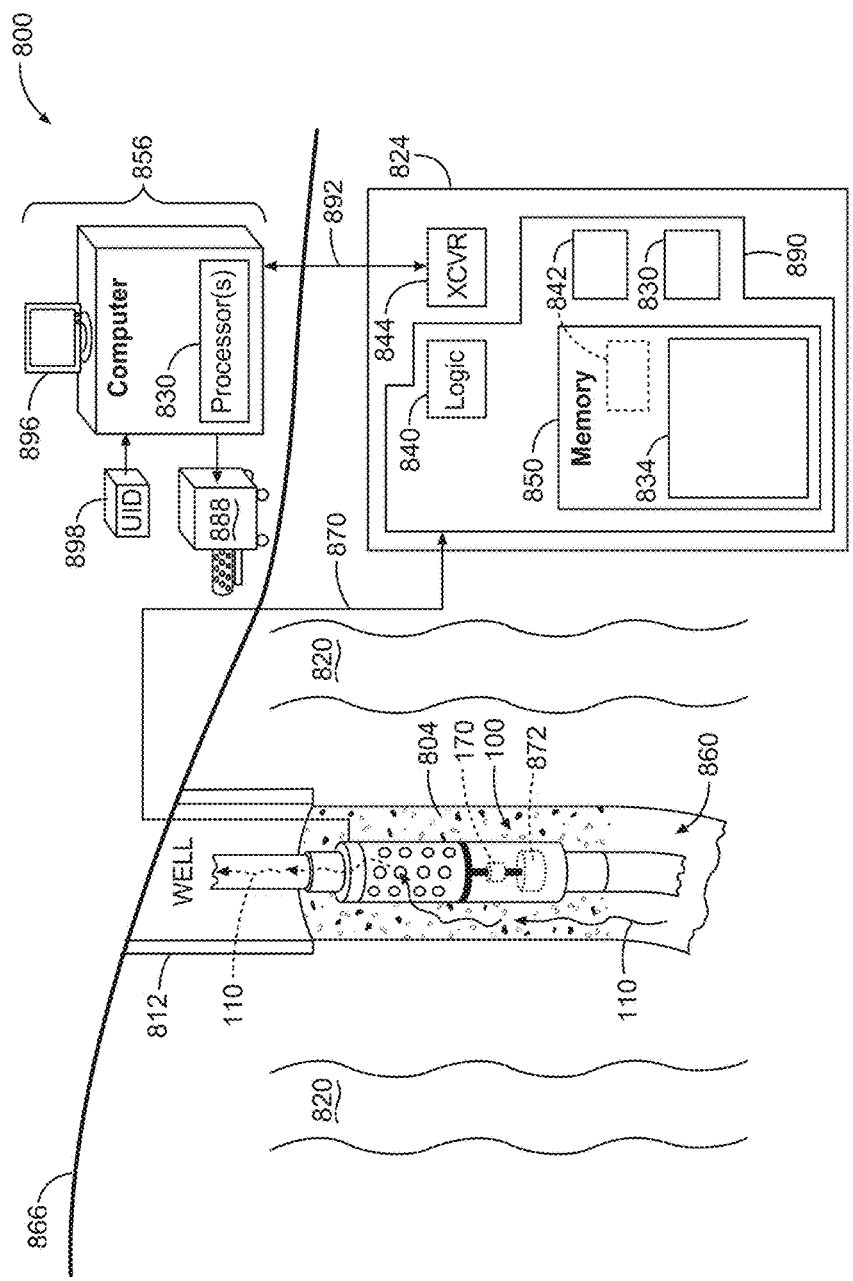
FIG. 8 illustrates multiple types of apparatus according to various embodiments, along with a horizontal well 810 in which an ICD apparatus has been placed.

Referring now to FIGS. 1 and 8, it can be seen that when the apparatus 100 has been placed downhole, the flow of fluids 110 may result in filling the annulus 804 between the apparatus 100 and the formation with sand or other debris.

The annulus 860 may also be deliberately filled with porous material, such as gravel. When the annulus 860 fills in this manner, the flow of fluid 110 is usually directed to the nearest screen surface.

Figure 2:
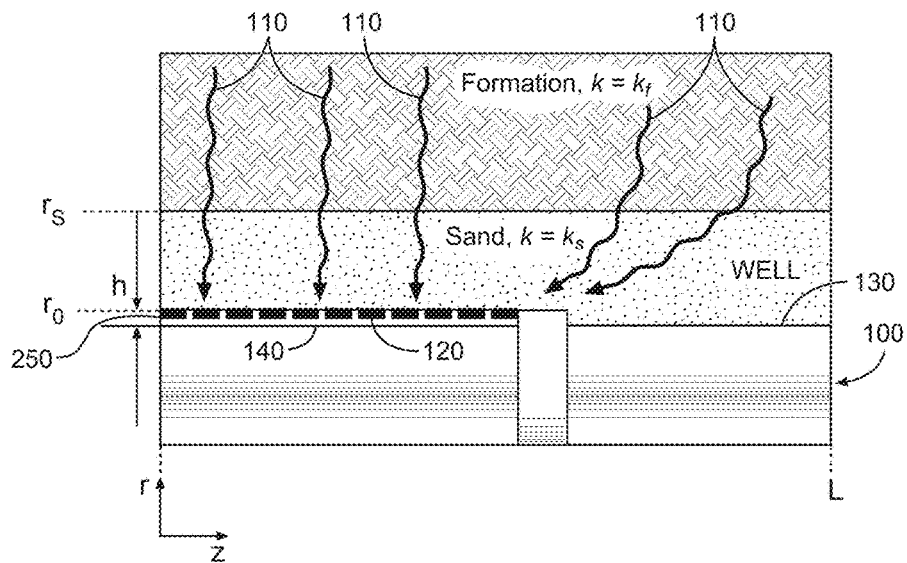
FIG. 2 is a side, cut-away diagram of fluids flowing in the vicinity of an ICD apparatus, according to various embodiments of the invention.

FIG. 2 is a side, cut-away diagram of fluids 110 flowing in the vicinity of an ICD apparatus 100, according to various embodiments of the invention. In some embodiments, the screen 120 comprises a mesh, separated from the underlying surface of the base conduit (e.g., tubing) 140 by a gap 250 of width h, which in some embodiments is determined by the height of the ribs 146 (see FIG. 1) that serve to space the screen 120 apart from the outer surface of the wall 142 of the base conduit 140.

At one end of the gap 250 there are the entry orifices for receiving the fluid 110 (e.g., production fluid) entering the screen 120. The flow in the gap 250 is directed mostly axially (in the direction r) and is described by the lubrication theory equations:

$$r = r_0, z < 0: h \frac{\partial V}{\partial z} = J; \quad (1)$$

$$V = -\frac{h^2}{12\mu} \frac{\partial p}{\partial z}$$

$$J = \frac{k_s}{\mu} \left(\frac{\partial p}{\partial r}\right)_{r_0};$$

$$r = r_0, z = -z_m: V = 0$$

$$r = r_0, z = 0: p = p_i$$

where V is the flow velocity in the gap, $\mu$ and p are the fluid viscosity and pressure, respectively, $p_i$ is the pressure at the inlet, $z_m$ is the length of the screen, r is the radial coordinate, and z is the axial distance from the inlet point of the apparatus 100. For simplicity in terms of geometry, it is assumed that all sections of the apparatus 100 have the same radius $r_0$, and the gap width h is much smaller than $r_0$.

The pressure distribution in the sand layer with permeability $k_s$ and formation with permeability $k_f$ is described by the following Laplace equation $$r > r_0: \frac{\partial^2 p}{\partial z^2} + \frac{1}{r} \frac{\partial}{\partial r}\left(r \frac{\partial p}{\partial r}\right) = 0 \quad (2)$$

$$r = r_0, z \geq 0: \left(\frac{\partial p}{\partial r}\right)_{r_0} = 0$$

$$r = r_s: k_s \left(\frac{\partial p}{\partial r}\right)_s = k_f \left(\frac{\partial p}{\partial r}\right)_f$$

where $r_s$ is the radial coordinate of the sand-formation border.

Equations (1) and (2) are arranged to imply that there is no fluid flowing from the wellbore through the shroud wall. Thus, using equation (1) as a de facto boundary condition for solving the Laplace equation (2) renders resolving the flow details inside the under-screen gap 250 and substantially accelerates the solution process.

Figure 3:
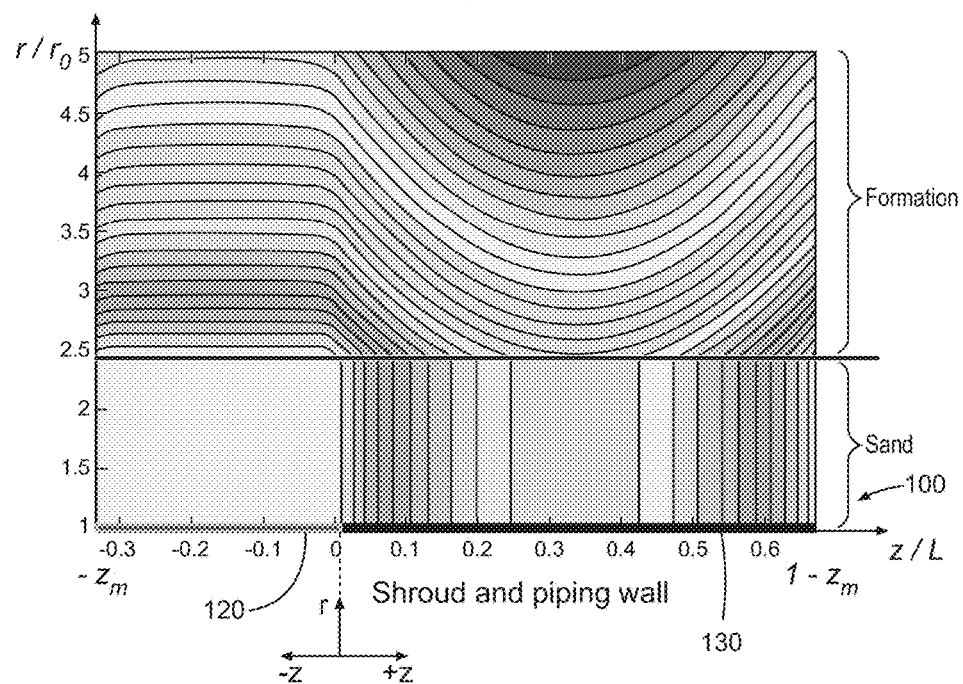
FIG. 3 is a side, cut-away diagram of simulated fluid pressure in the vicinity of an ICD apparatus, according to various embodiments of the invention.

FIG. 3 is a side, cut-away diagram of simulated fluid flow pressure in the vicinity of an ICD apparatus 100, according to various embodiments of the invention. This figure illustrates the isobars of pressure near an apparatus 100 with radius $r_0$=0.083 m in a formation with permeability $k_f$=0.2 D, when the sand permeability $k_s$=is 200 D, and the screen gap width is 0.005 m. Darker shading denotes areas of increase pressure, and lighter shading denotes areas of reduced pressure.

In the sand layer, the isobars of pressure are nearly vertical, implying that the variation of pressure in that layer is negligible. This property can be used to build an analytical solution for the pressure distribution.

Figure 4:
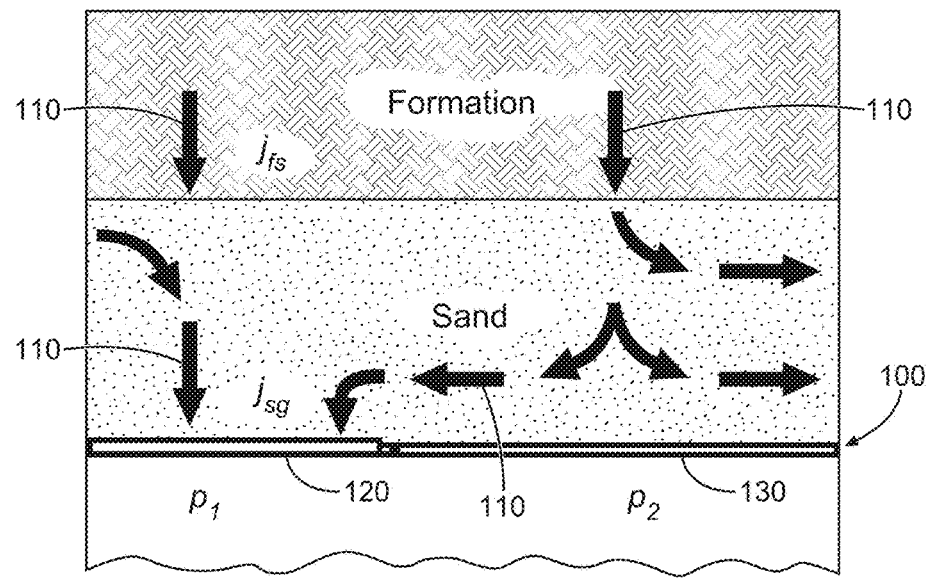
FIG. 4 is a simplified fluid flow diagram for an analytical solution to the total flow rate of a fluid in the vicinity of an ICD apparatus, according to various embodiment of the invention.

FIG. 4 is a simplified fluid flow diagram for an analytical solution to the total flow rate of a fluid in the vicinity of an ICD apparatus 100, according to various embodiment of the invention. Due to the high aspect ratio of the ratio $L/r_s$ in the formation, the flow of fluid 110 is directed mostly radially, so the steady-state pressure distribution adheres closely to a logarithmic expression. And since the pressure drop across the screen in the sand layer is assumed to be negligible, the pressure distribution in the layer can be described by the set of equations $$\left[\frac{h^3}{12\mu} + \frac{1}{2r_0}(r_s^2 - r_0^2)\frac{k_s}{\mu}\right]\frac{d^2 p_1}{dz^2} = \frac{k_f}{\mu} \frac{1}{r_0} \frac{p_B - p_1}{\ln\left(\frac{r_B}{r_s}\right)}; \quad (3)$$

$$z < 0$$

$$\frac{1}{2r_0}(r_s^2 - r_0^2)\frac{k_s}{\mu} \frac{d^2 p_1}{dz^2} = \frac{k_f}{\mu} \frac{1}{r_0} \frac{p_B - p_2}{\ln\left(\frac{r_B}{r_s}\right)};$$

$$z \geq 0$$

$$p_1(0) = p_2(0) = p_{in};$$

$$p_1(-z_m) = p_2(L - z_m);$$

$$\frac{dp_1}{dz}(-z_m) = \frac{dp_2}{dz}(L - z_m)$$

The first equation in the set of equations (3) represents the sum of momentum equations for the gap 250 under the screen and the sand layer above the screen, while the second equation in the set of equations (3) represents the momentum equation of the sand layer adjacent to the shroud. The explicit form of the inflow densities in the right-hand sides of the equations in the set (3) is based on assumption of a steady-state logarithmic pressure profile in the formation, with $p_B$ equal to pressure at the boundary between the sand and the formation. It is assumed that the inlet pressure $p_{in}$ of the apparatus 100 is known. The last equation in the set (3) represents the periodicity conditions, implying a smooth matching of distributions $p_1(z)$ and $p_2(z)$ at the beginning and the end (e.g., at the two ports) of the apparatus 100.

The set of equations (3) can be solved to yield the analytical solution for pressure distribution in the sand layer, as the set of equations (4) below:

$$z < 0: p_1 = p_B + (p_B - p_{in})[A_1 \sinh(\lambda_1 z) - \cosh(\lambda_1 z)] \quad (4)$$

$$z > 0: p_2 = p_B + (p_B - p_{in})[A_2 \sinh(\lambda_2 z) - \cosh(\lambda_2 z)]$$

$$\lambda_1 = \frac{1}{L}\left(\frac{\Omega}{1+\omega}\right)^{\frac{1}{2}};$$

$$\lambda_2 = \frac{1}{L}\Omega^{\frac{1}{2}}$$

$$\Omega = \frac{2k_f L^2}{k_s(r_s^2 - r_0^2)\ln\left(\frac{r_B}{r_s}\right)};$$

-continued $$\omega = \frac{h^3}{6k_s} \frac{r_0}{(r_s^2 - r_0^2)}$$

where the constants $A_1$ and $A_2$ are defined by the expressions $$A_1 = \frac{\lambda_2 F_1 \cosh[\lambda_2(L-z_m)] - F_2 \sinh[\lambda_2(L-z_m)]}{\lambda_2 \sinh(\lambda_1 z_m) \cosh[\lambda_2(L-z_m)] + \lambda_1 \cosh(\lambda_1 z_m) \sinh[\lambda_2(L-z_m)]} \quad (5)$$

$$A_2 = \frac{F_1 - A_1 \sinh(\lambda_1 z_m)}{\sinh[\lambda_2(L-z_m)]}$$

$$F_1 = \cosh[\lambda_2(L-z_m)] - \cosh(\lambda_1 z_m)$$

$$F_2 = \lambda_1 \sinh(\lambda_1 z_m) + \lambda_2 \sinh[\lambda_2(L-z_m)]$$

Assuming the same steady-state logarithmic pressure profile, the set of equations (4) can be used to build the analytical solution for pressure in the formation as $$r \geq r_s: \; p = p_B + [p_B - p_{1,2}(z)] \left[ \frac{\ln\left(\frac{r}{r_s}\right)}{\ln\left(\frac{r_B}{r_s}\right)} - 1 \right] \quad (6)$$

At the interface between the sand layer and the formation ($r=r_s$) equation (6) is reduced to equation (4) for the pressure distribution in the sand layer.

Figure 5:
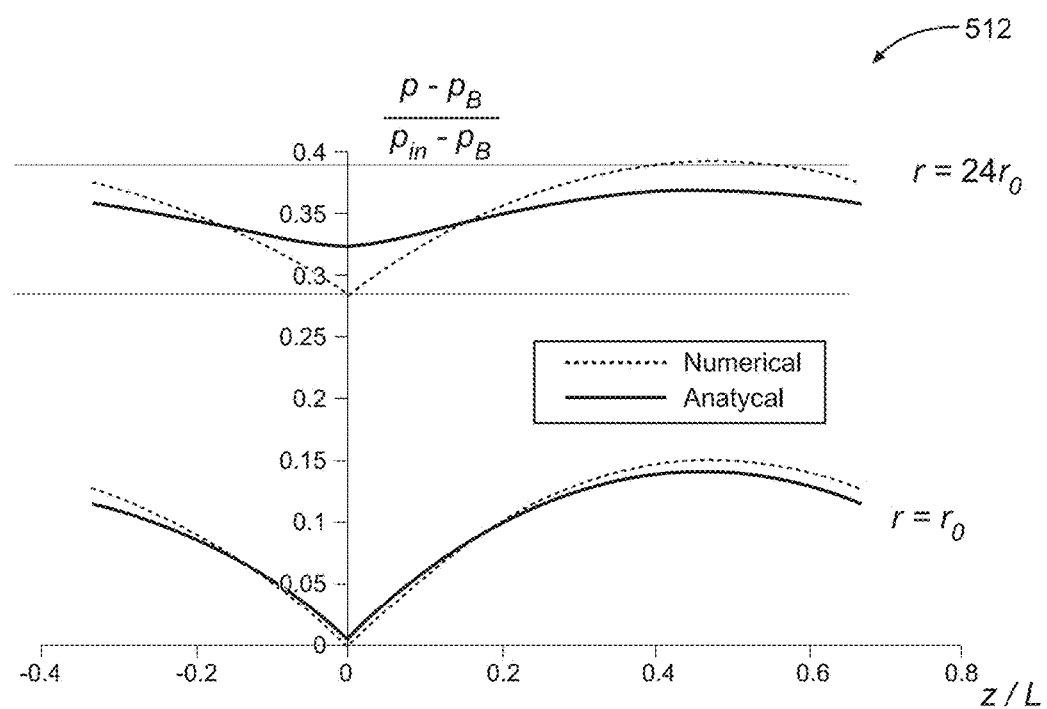
FIG. 5 is a graph comparing a conventional numerical solution to an analytical solution of the predicted fluid pressure distribution profiles in the vicinity of an ICD apparatus, according to various embodiment of the invention.

FIG. 5 is a graph 512 comparing a conventional numerical solution to an analytical solution of the predicted fluid pressure distribution profiles in the vicinity of an ICD apparatus, according to various embodiment of the invention. In this graph 512, the numerically and analytically calculated profiles of pressure in the sand layer are shown in the lower portion of the graph. The numerically and analytically calculated profiles of pressure at 2 m from the well axis are shown in the upper portion of the graph 512. In each case, a relatively narrow gap width h of 0.0005 m is used.

Figure 6:
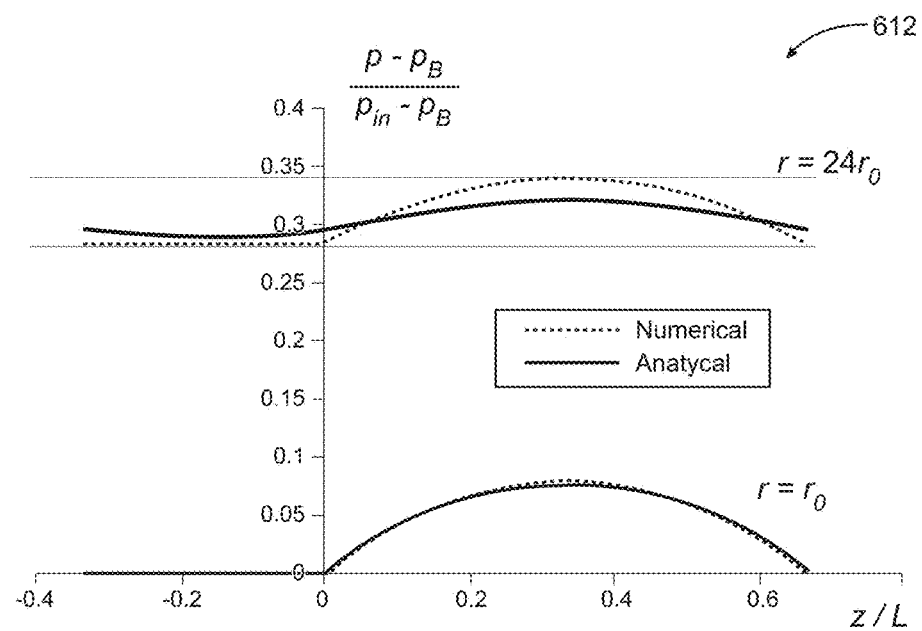
FIG. 6 is a graph comparing a conventional numerical solution to an analytical solution of the predicted (normalized) fluid pressure distribution profiles in the vicinity of an ICD apparatus, according to various embodiment of the invention.

FIG. 6 is a graph 612 comparing a conventional numerical solution to an analytical solution of the predicted (normalized) fluid pressure distribution profiles in the vicinity of an ICD apparatus, according to various embodiment of the invention. In this graph 612, the numerically and analytically calculated profiles of pressure in the sand layer are shown in the lower portion of the graph. The numerically and analytically calculated profiles of pressure at 2 m from the well axis are shown in the upper portion of the graph 612. In this case, a wider gap width h of 0.005 m is used.

FIGS. 5 and 6 thus facilitate the comparison of the pressure distributions predicted by the analytical solution represented by Equations (4)-(6) and direct numerical simulations that are used to solve Equations (1) and (2). The parameters of the formation for these calculations are the same as those used in the calculations that produced the graphic representation of pressure in FIG. 3. The analytical and numerical results are in remarkably good agreement, particularly in the sand layer, which implies that the set of Equations (4)-(6) can be used for nearly instant analysis of the flow in the vicinity of an apparatus 100, such as an ICD located in a well.

In particular, the integral flow rate to the apparatus 100 can be rapidly determined. For example, Equation (6) yields the following equation as Equation (7), representing the total flow rate to an apparatus 100, realized as an ICD section of a piping string:

$$J = \frac{2\pi k_f (p_B - p_{in})}{\mu r_s \ln\left(\frac{r_B}{r_s}\right) \lambda_1 \lambda_2} (f_1 + f_2) \quad (7)$$

$$f_1 = \lambda_2 \{\sinh(\lambda_1 z_m) - A_1[1 - \cosh(\lambda_1 z_m)]\}$$

$$f_2 = \lambda_1 \{\sinh[\lambda_2(L-z_m)] + A_2[1 - \cosh[\lambda_2(L-z_m)]]\}$$

Figure 7:
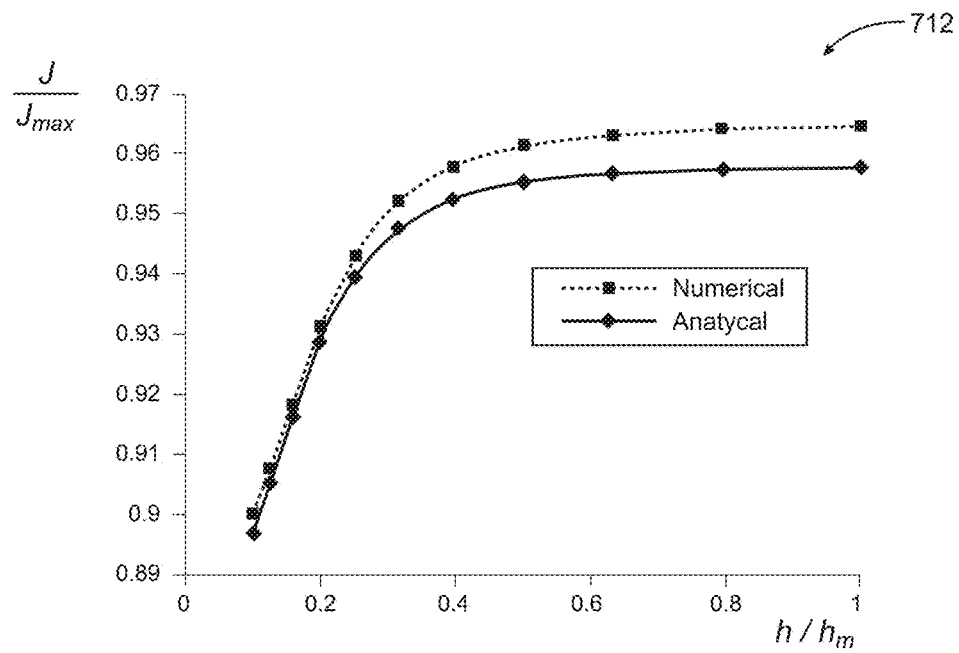
FIG. 7 is a graph comparing a conventional numerical solution to an analytical solution with respect to the total flow rate and normalized gap width of a fluid moving in the vicinity of an ICD apparatus, according to various embodiment of the invention.

FIG. 7 is a graph 712 comparing a conventional numerical solution to an analytical solution with respect to the total flow rate and normalized gap width of a fluid moving in the vicinity of an ICD, according to various embodiment of the invention. In this figure, the graph 712 shows the dependence of the total flow rate into the apparatus 100, as predicted by the analytical equation, and a numerical solution. These results have been obtained over a normalized gap width of $h/h_m$, where $h_m=0.005$ m. The flow rate is normalized by its maximum value, which can be expressed as:

$$J_m = \frac{2\pi k_f (p_B - p_{in})}{\mu r_s \ln\left(\frac{r_B}{r_s}\right)_2} \quad (8)$$

In this case, the difference between the analytical solution and numerically calculated values for the flow rate are less than 1%.

Thus, it is clear that the analytical solution can serve as a useful commercial model for pressure and flow field near sections of piping where an apparatus 100 (e.g., an ICD section) has been disposed in a wellbore, providing a prediction of the smoothing of the non-uniform axial pressure distribution as distance from the wellbore increases. The analytical equations have been validated by comparison with detailed numerical simulation results using the Finite Difference Method. Thus, the analytical solution can be used in a variety of applications related to well completion design and the mechanical optimization of ICDs.

FIG. 8 illustrates multiple types of apparatus 800 according to various embodiments, along with a horizontal well 810 in which an ICD apparatus 100 has been placed. For example, in some embodiments, an apparatus 800 includes one or more processors 830 that may be located at the surface 866, as part of a selection apparatus 856, or in a data acquisition and simulation apparatus 824, parts of which may be located above or below the Earth's surface 866 (e.g., attached to the apparatus 100).

An apparatus 800 may further comprise a data transceiver 844 (e.g., a telemetry transmitter and/or receiver) to transmit acquired data 870 to a selection apparatus 856. The data 870 may comprise pressure information, or other information which may be used to determine the value of one or more variables shown in the analytical solution described herein, perhaps based on measurements performed within a formation 820 surrounding the well 812. Logic 840 can be used to acquire the data 870 as signals, according to the various methods described herein. The acquired data 870, as well as other data, can be stored in the memory 850, perhaps as part of a database 834.

The processors 830 can be used to process the data 870 to determine solutions to the analytical solution of fluid pressure distribution in the vicinity of the ICD apparatus 100. A program of stored instructions 842 may be used to direct the activity of the processors 830. In some embodiments, the stored instructions 842 may be located within the memory 850, or within the simulation apparatus 856, or both.

Thus, referring to FIGS. 1 and 8, it can be seen that many embodiments may be realized. For example, an apparatus 800 may comprise a fluid flow simulator that has a processor and a stored program to direct the operations of the processor, to vary the area occupied by the screen of an ICD, and to determine the resulting performance of the ICD. Currently available fluid flow simulators do not even attempt to calculate ICD performance in situ (due to variations in the screen size) because it is too computationally intensive to be practical. The analytical solution for flow and pressure distributions described herein however, greatly simplifies the screen area selection process by the efficient use of boundary conditions with respect to the area of the screen.

Thus, in some embodiments, a simulation apparatus 800 may comprise a processor 830 and a memory 850 to store a set of instructions 842, which when executed by the processor 830, forms a machine programmed to generate an analytical solution to simulate multiple scenarios for a total flow rate J in order to find one of the scenarios that meets a desired total flow rate for a fluid flow 110 entering a portion of a screen 120 to pass through at least one orifice 160 in a base conduit 140 covered by the screen 120. The total flow rate J may be provided by the analytical solution $$J = \frac{2\pi k_f (p_B - p_{in})}{\mu r_s \ln\left(\frac{r_B}{r_s}\right) \lambda_1 \lambda_2}(f_1 + f_2)$$

$$f_1 = \lambda_2\{\sinh(\lambda_1 z_m) - A_1[1 - \cosh(\lambda_1 z_m)]\}$$

$$f_2 = \lambda_1\{\sinh[\lambda_2(L - z_m)] + A_2[1 - \cosh[\lambda_2(L - z_m)]]\}$$

where $p_B$ is a boundary pressure associated with a surrounding formation, $p_{in}$ is a pressure associated with an inlet gap between the screen and the base conduit, $\mu$ is a viscosity of the fluid, $r_s$ is a radius of a sand-formation interface surrounding the conduit, $r_B$ is a drainage radius associated with a well defining the sand-formation interface, $\lambda_1$ is $$\frac{\sqrt{\frac{\Omega}{1+\omega}}}{L},$$

$\lambda_2$ is $$\frac{\sqrt{\Omega}}{L},$$

$z_m$ is a length of the screen that is exposed to the fluid, $A_1$ is $$\frac{\lambda_2 F_1 \cosh[\lambda_2(L-z_m)] - F_2 \sinh[\lambda_2(L-z_m)]}{\lambda_2 \sinh(\lambda_1 z_m)\cosh[\lambda_2(L-z_m)] + \lambda_1 \cosh(\lambda_1 z_m)\sinh[\lambda_2(L-z_m)]},$$

$A_2$ is $$\frac{F_1 - A_1 \sinh(\lambda_1 z_m)}{\sinh[\lambda_2(L-z_m)]},$$

$F_1$ is $\cos h[\lambda_2(L-z_m)] - \cos h(\lambda_1 z_m)$, $F_2$ is $\lambda_1 \sin h(\lambda_1 z_m) + \lambda_2 \sin h[\lambda_2(L-z_m)]$, L is a length of the base conduit, $\Omega$ is $$\frac{2k_f L^2}{k_s(r_s^2 - r_0^2)\ln\left(\frac{r_B}{r_s}\right)},$$

$\omega$ is $$\frac{h^3}{6k_s} \frac{r_0}{(r_s^2 - r_0^2)},$$

$k_f$ is a permeability of the formation in the sand-formation interface, $k_s$ is a permeability of the sand in the sand-formation interface, and $r_0$ is a radius of the conduit. The scenarios may be associated with coupled reservoir-wellbore simulations for wells 812 containing inflow control device completions (e.g., as shown in FIG. 8).

In some embodiments, the apparatus 800 may comprise a display 896 to display the total flow rate J for the scenarios at an interface between the screen 120 and the base conduit 140.

The simulation apparatus 856 can receive real-time information values to adjust the total flow rate J for each scenario. Thus, in some embodiments, the apparatus 800 comprises a data receiver (e.g., as part of the transceiver 844) to receive one or more values associated with at least one of the boundary pressure $p_B$ or the pressure $p_{in}$ associated with an inlet gap of size h. In some embodiments, the apparatus 800 comprises a user input device 898 (e.g., a keyboard, laptop computer, tablet, or touch screen) to receive one or more values associated with at least one of the boundary pressure $p_B$, the pressure $p_{in}$, the viscosity $\mu$, the radius $r_s$, the radius $r_B$, the length of the screen $z_m$, the length of the base conduit L, the permeability $k_f$, the permeability $k_s$, or the radius $r_0$.

In some embodiments, the apparatus 800 comprises a selection apparatus, comprising a display 896 and a selection circuit 890 to determine the length of a screen 120 or a gap size between the screen 120 and a base conduit 140 using an analytical solution for a the distribution of a fluid flowing proximate to the screen 120. The screen 120 may be formed to attach to an outer section of a wall 142 defined by two end ports 148 in a base conduit 140 having at least one orifice 160. The length of the screen 120 can be exposed to the fluid 110 flowing through the screen 120 into the at least one orifice 160, and the analytical solution may be used to determine an area associated with the length of the screen 120. The selection circuit 890 may be used to provide a result to enable displaying values associated with the length of the screen or the gap size on the display 896.

In some embodiments, the apparatus 800 comprises a transmitter (e.g., as part of the transceiver 844) to transmit the values (e.g., associated with the length of the screen or the gap size) to a location, such as the location of the apparatus 856, coupled to the selection apparatus via a wired or a wireless connection 892. The apparatus 800 may comprise a screen fabrication apparatus 888, well known to those of ordinary skill in the art, to receive the values (e.g., associated with the length of the screen or the gap size) to determine fabrication parameters of the screen. The total flow rate J may be determined as noted previously.

In some embodiments, an ICD apparatus comprises a base conduit (e.g., a section of pipe), and a screen that filters fluid flowing into the conduit, where the area of the screen is determined by an analytical solution, as noted above. Thus, an ICD apparatus 100 may comprise a base conduit 140 with two end ports 148 and at least one orifice 160 in a wall 142 defined by the end ports 148. The apparatus 100 may further comprise a screen 120 to attach to an outer section of the wall 142, wherein a portion of the screen 120 can be exposed to a fluid 110 flowing through the portion into the at least one orifice 160. The analytical solution for the pressure distribution of the fluid 110 proximate to the screen 120 can be used to determine the area of the screen portion.

A shroud 130 can be used to reduce the cost of the apparatus 100. This is because the apparatus 100 is typically surrounded by a layer of gravel or sand when put in place downhole, so the flow of fluid 110 from the reservoir can be directed to a relatively small area of the apparatus 100 that is covered by the screen 120. The screen 120 usually forms a large part of the expense in constructing the apparatus 100, so it is useful to reduce the screen area as much as possible. However, the screen area should not be made too small, because the density of the flow of fluid 110 though the screen may become high enough to damage the screen itself, due to the particles of debris (e.g., sand) constantly passing through the screen 120 as part of the fluid flow 110. Thus, the apparatus 100 may comprise a shroud 130 to attach to the base conduit 140.

In some embodiments, the shroud 130 is located near the middle of the base conduit 140, and is not movable. That is, many ICD apparatus 100 are preconfigured on the surface before installation and are fixed in that same configuration thereafter.

In some embodiments however, an ICD apparatus 100 can be manufactured with the ability to change its configuration after installation. That is, a movable shroud 130 can be used to selectively expose the desired amount of screen area in some embodiments, such that an ICD can be manufactured with the ability to change its configuration after installation.

For example, the shroud 130 may be configured as a sliding sleeve technology. As production requirements change or the flow of fluids 110 decreases due to well depletion, the flow of fluids 110 can be adjusted by moving the shroud 130 to cover more or less of the screen 120. Thus, the apparatus 100 may comprise a movable shroud 130 to partially cover the screen 120, to expose an adjustable fraction of the screen area. An actuator, such as an electrical or hydraulic actuator, can be used to move the shroud. Thus, in some embodiments, the apparatus 100 comprises an actuator 170 to move the movable shroud 130 to adjust a value of the adjustable fraction of the screen area).

A receiver 872, such as a pressure pulse receiver, can accept commands from the surface 866 (e.g., from the apparatus 856) to adjust the area of the screen that is exposed to the flow of fluids 110. Thus, the apparatus 800 may comprise a receiver 872 to receive commands to expose a selected area of the portion of the screen 120.

The ICD apparatus 100 may be connected to a string of pipe 860 and placed downhole. Thus, the apparatus 800 may comprise a string of pipe 860 disposed in a well 812 downhole and coupled to the base conduit 160.

The apparatus 100, 800, 824, 856; fluids 110; screen 120; shroud 130; conduit 140; wall 142; ribs 146; ports 148; orifices 160; actuator 170; gap 250; formation 820; processors 830; database 834; logic 840; instructions 842; transceiver 844; memory 850; pipe 860; data 870; receiver 872; screen fabrication apparatus 888; circuit 890; connection 892; display 896; and user input device 898 may all be characterized as "modules" herein.

Such modules may include hardware circuitry, and/or a processor and/or memory circuits, software program modules and objects, and/or firmware, and combinations thereof, as desired by the architect of the apparatus 100, 800, 824, and 856 as appropriate for particular implementations of various embodiments. For example, in some embodiments, such modules may be included in an apparatus operational and/or reservoir simulation package, such as a software electrical signal simulation package, a power usage and distribution simulation package, a power/heat dissipation simulation package, a downhole fluid flow simulation package (including an ICD fluid flow simulation package), and/or a combination of software and hardware used to simulate the operation of various potential embodiments.

It should also be understood that the apparatus and systems of various embodiments can be used in applications other than for petroleum recovery operations, and thus, various embodiments are not to be so limited. The illustrations of apparatus 100, 800, 824, and 856 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules. Such apparatus and systems may further be included as sub-components within a variety of electronic systems, such as televisions, cellular telephones, personal computers, workstations, radios, video players, vehicles, signal processing for flow control tools and smart transducer interface node telemetry systems, among others. Some embodiments include a number of methods.

Figure 9:
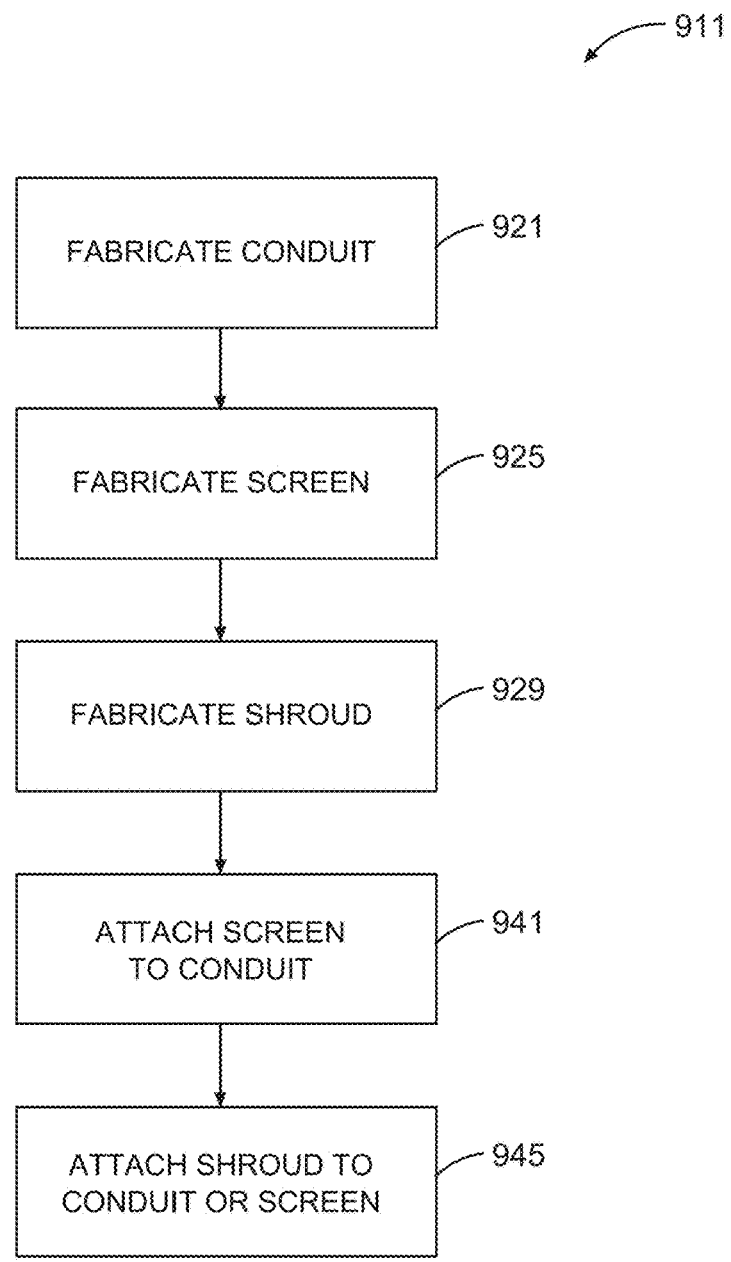
FIG. 9 is a flow chart illustrating several methods according to various embodiments of the invention.

FIG. 9 is a flow chart illustrating several methods 911 according to various embodiments of the invention. It should be noted that any activity forming a part of any one of the method embodiments described herein may be performed via programmed robots on an assembly line, according to programmed movements that are well known to those of ordinary skill in the art.

For example, depending on the in-house capability of an individual manufacturer, a method 911 may begin at block 921 with fabricating some length of base conduit. The method 911 may include fabricating the screen at block 925. The method 911 may also include fabricating the shroud at block 929. Of course, some manufacturers may choose to purchase these components, instead of making them.

In some embodiments, a method 911 includes the construction of an ICD apparatus, to include attaching a screen and shroud to the base conduit, wherein the screen characteristics are selected according to the analytical methods described above.

Thus, in some embodiments, a method 911 includes, at block 941, attaching a screen to a base conduit forming part of a downhole ICD. As noted previously, the base conduit may have two end ports and one or more orifices formed in a wall defined by the end ports. The screen can be attached so that some portion (including all) of the screen can be exposed to a fluid flowing through the exposed portion into the orifice(s). The area of the exposed portion can determined according to an analytical solution for an estimated pressure distribution of the fluid proximate to the screen, with the analytical solution for a total flow rate J being determined as described above. The method 911 may conclude with attaching a shroud to the base conduit or the screen at block 945.

Thus, in some embodiments, the apparatus, systems, and methods described herein serve to use an analytical solution for the efficient design of an ICD apparatus, to account for non-uniform pressure and flow distribution along the ICD apparatus shroud and screen. The apparatus, systems, and methods can be used to improve the accuracy and speed of coupled reservoir-wellbore simulations for wells containing ICD completions.

It should be noted that the methods described herein do not have to be executed in the order described, or in any particular order. Moreover, various activities described with respect to the methods identified herein can be executed in iterative, serial, or parallel fashion. The various elements of each method (e.g., the activities and methods shown in FIG. 9) can be substituted, one for another, within and between various parts of the activities and methods. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. For example, the programs may be structured in an object-orientated format using an object-oriented language such as Java or C#. In another example, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment. Thus, other embodiments may be realized.

Figure 10:
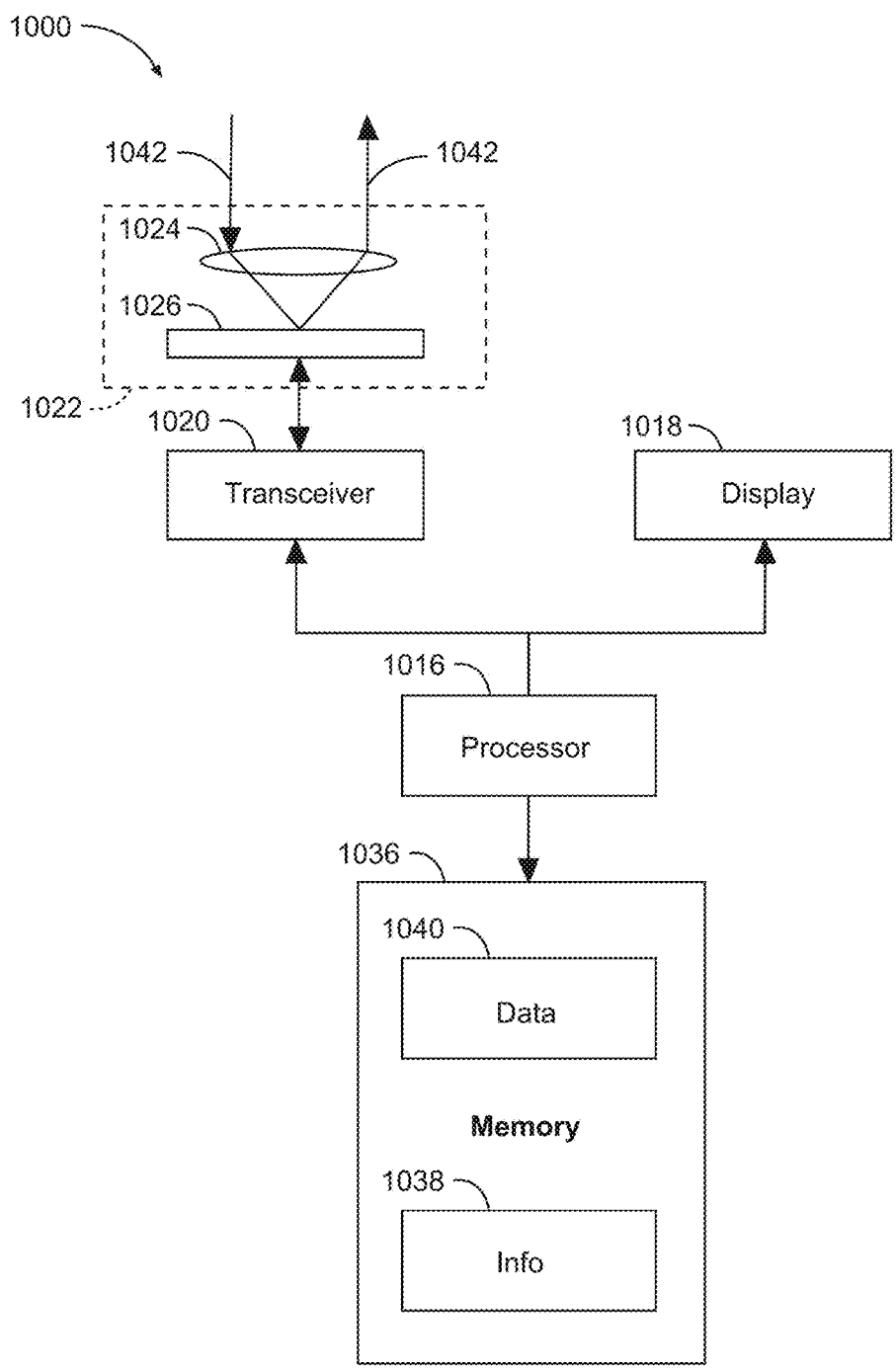
FIG. 10 is a block diagram of an article according to various embodiments of the invention.

For example, FIG. 10 is a block diagram of an article 1000 of manufacture according to various embodiments of the invention. Such articles 1000 may include a computer, an apparatus designed specifically to implement the analytic solution described herein, within the context of data entered or received to characterize the conditions surrounding an ICD apparatus. Such articles may further comprise a memory system, a magnetic or optical disk, or some other storage device. The article 1000 may include one or more processors 1016 coupled to a machine-accessible medium such as a memory 1036 (e.g., removable storage media, as well as any tangible, non-transitory memory including an electrical, optical, or electromagnetic conductor) having associated information 1038 (e.g., computer program instructions and/or data), which when executed by one or more of the processors 1016, results in a machine (e.g., the article 1000) performing any actions described with respect to the methods of FIG. 9, and the apparatus of FIGS. 1 and 8. The processors 1016 may comprise one or more processors sold by Intel Corporation (e.g., Intel® Core™ processor family), Advanced Micro Devices (e.g., AMD Athlon™ processors), and other semiconductor manufacturers.

In some embodiments, the article 1000 may comprise one or more processors 1016 coupled to a display 1018 to display data processed by the processor 1016 and/or a wireless transceiver 1020 (e.g., a downhole telemetry transceiver) to receive and transmit data processed by the processor.

The memory system(s) included in the article 1000 may include memory 1036 comprising volatile memory (e.g., dynamic random access memory) and/or non-volatile memory. The memory 1036 may be used to store data 1040 processed by the processor 1016.

In various embodiments, the article 1000 may comprise communication apparatus 1022, which may in turn include amplifiers 1026 (e.g., preamplifiers or power amplifiers) and one or more antenna 1024 (e.g., transmitting antennas and/or receiving antennas). Signals 1042 received or transmitted by the communication apparatus 1022 may be processed according to the methods described herein.

Many variations of the article 1000 are possible. For example, in various embodiments, the article 1000 may comprise a downhole tool, including the apparatus 100 shown in FIG. 1. In some embodiments, the article 1000 is similar to or identical to the apparatus 100, or the apparatus 800, 824, 856 shown in FIG. 8.

In conclusion, although it is technically possible for three-dimensional (3D) finite element modeling (FEM) simulators to predict fluid pressure/flow fields in the vicinity of complex completions, the results aren't commonly used as a part of production engineering simulation software. This is because the direct coupling involved serves to slow down simulation time to a point that is commercially infeasible. As a matter of contrast, the various embodiments proposed herein provide a numerically-verified analytical solution for the pressure drop related to screen/shroud geometry of an ICD apparatus, with the result of vastly improving the operational speed of the computers programmed to carry out the simulation. Moreover, the accuracy of the analytical simulation results are so close to those that can be obtained by a numerical solution that apparatus, systems, and methods that operate according to the analytical solution provided herein are well-suited for immediate use in the field.

The analytical solution that is common to various embodiments described herein can thus replace more costly numerical ICD performance simulations, and may allow an agile completion design function that is immediately responsive to wellbore/reservoir properties. As a result, the value of the services provided by an operation/exploration company can be significantly enhanced.

The accompanying drawings that form a part hereof, show by way of illustration, and not of limitation, specific embodiments in which the subject matter may be practiced. The embodiments illustrated are described in sufficient detail to enable those of ordinary skill in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of ordinary skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

The invention claimed is:

1. A simulation apparatus, comprising:
a processor; and
a memory to store a set of instructions, which when executed by the processor, forms a machine programmed to generate an analytical solution to simulate multiple scenarios for a total flow rate J in order to find one of the scenarios that meets a desired flow rate for a fluid flow entering a portion of a screen to pass through at least one orifice in a base conduit covered by the screen, wherein the total flow rate J is provided by $$J = \frac{2\pi k_f(p_B - p_{in})}{\mu r_s \ln\left(\frac{r_B}{r_s}\right)\lambda_1\lambda_2}(f_1 + f_2)$$

$$f_1 = \lambda_2\{\sinh(\lambda_1 z_m) - A_1[1 - \cosh(\lambda_1 z_m)]\}$$

$$f_2 = \lambda_1\{\sinh[\lambda_2(L - z_m)] + A_2[1 - \cosh(\lambda_2(L - z_m))]\}$$

where $p_B$ is a boundary pressure associated with a surrounding formation, $p_{in}$ is a pressure associated with an inlet gap between the screen and the base conduit, $\mu$ is a viscosity of the fluid, $r_s$ is a radius of a sand-formation interface surrounding the conduit, $r_B$ is a drainage radius associated with a well defining the sand-formation interface, $\lambda_1$ is $$\frac{\sqrt{\frac{\Omega}{1+\omega}}}{L},$$

$\lambda_2$ is $$\frac{\sqrt{\Omega}}{L},$$

$z_m$ is a length of the screen that is exposed to the fluid, $A_1$ is $$\frac{\lambda_2 F_1 \cosh[\lambda_2(L-z_m)] - F_2\sinh[\lambda_2(L-z_m)]}{\lambda_2\sinh(\lambda_1 z_m)\cosh[\lambda_2(L-z_m)] + \lambda_1\cosh(\lambda_1 z_m)\sinh[\lambda_2(L-z_m)]},$$

$A_2$ is $$\frac{F_1 - A_1\sinh(\lambda_1 z_m)}{\sinh[\lambda_2(L-z_m)]},$$

$F_1$ is $\cosh[\lambda_2(L-z_m)] - \cosh(\lambda_1 z_m)$, $F_2$ is $\lambda_1 \sinh(\lambda_1 z_m) + \lambda_2 \sinh[\lambda_2(L-z_m)]$, L is a length of the base conduit, $\Omega$ is $$\frac{2k_f L^2}{k_s(r_s^2 - r_0^2)\ln\left(\frac{r_B}{r_s}\right)},$$

$\omega$ is $$\frac{h^3}{6k_s}\frac{r_0}{(r_s^2 - r_0^2)},$$

$k_f$ is a permeability of the formation in the sand-formation interface, $k_s$ is a permeability of the sand in the sand-formation interface, and $r_0$ is a radius of the conduit.

2. The apparatus of claim 1, further comprising:
a display to display the total flow rate J for the scenarios at an interface between the screen and the base conduit.

3. The apparatus of claim 1, further comprising:
a data receiver to receive one or more values associated with at least one of the boundary pressure $p_B$ or the pressure $p_{in}$ associated with the inlet gap.

4. The apparatus of claim 1, further comprising:
a user input device to receive one or more values associated with at least one of the boundary pressure $p_B$, the pressure $p_{in}$, the viscosity $\mu$, the radius $r_s$, the radius $r_B$, the length of the screen $z_m$, the length of the base conduit L, the permeability $k_f$, the permeability $k_s$, or the radius $r_0$.

5. The apparatus of claim 1, wherein the scenarios are associated with coupled reservoir-wellbore simulations for wells containing inflow control device completions.

6. A method, comprising:
storing a set of instructions in a memory; executing the set of instructions by a processor to form a machine programmed to generate an analytical solution to simulate multiple scenarios for a total flow rate J in order to find one of the scenarios that meets a desired flow rate for a fluid flow entering a portion of a screen to pass through at least one orifice in a base conduit covered by the screen; wherein the analytical solution for the total flow rate J of the pressure distribution is provided by $$J = \frac{2\pi k_f(p_B - p_{in})}{\mu r_s \ln\left(\frac{r_B}{r_s}\right)\lambda_1\lambda_2}(f_1 + f_2)$$

$$f_1 = \lambda_2\{\sinh(\lambda_1 z_m) - A_1[1 - \cosh(\lambda_1 z_m)]\}$$

$$f_2 = \lambda_1\{\sinh[\lambda_2(L-z_m)] + A_2[1 - \cosh(\lambda_2(L-z_m))]\}$$

where $p_B$ is a boundary pressure associated with a surrounding formation, $p_{in}$ is a pressure associated with an inlet gap between the screen and the base conduit, $\mu$ is a viscosity of the fluid, $r_s$ is a radius of a sand-formation interface surrounding the conduit, $r_B$ is a drainage radius associated with a well defining the sand-formation interface, $\lambda_1$ is $$\frac{\sqrt{\frac{\Omega}{1+\omega}}}{L},$$

$\lambda_2$ is $$\frac{\sqrt{\Omega}}{L},$$

$z_m$ is a length of the screen that is exposed to the fluid, $A_1$ is $$\frac{\lambda_2 F_1 \cosh[\lambda_2(L-z_m)] - F_2 \sinh[\lambda_2(L-z_m)]}{\lambda_2 \sinh(\lambda_1 z_m)\cosh[\lambda_2(L-z_m)] + \lambda_1 \cosh(\lambda_1 z_m)\sinh[\lambda_2(L-z_m)]},$$

$A_2$ is $$\frac{F_1 - A_1 \sinh(\lambda_1 z_m)}{\sinh[\lambda_2(L-z_m)]},$$

$F_1$ is $\cos h[\lambda_2(L-z_m)] - \cos h(\lambda_1 z_m)$, $F_2$ is $\lambda_1 \sin h(\lambda_1 z_m) + \lambda_2 \sin h[\lambda_2(L-z_m)]$, L is a length of the base conduit, $\Omega$ is $$\frac{2k_f L^2}{k_s (r_s^2 - r_0^2) \ln\left(\frac{r_B}{r_s}\right)},$$

$\omega$ is $$\frac{h^3}{6k_s} \frac{r_0}{(r_s^2 - r_0^2)},$$

$k_f$ is a permeability of the formation in the sand-formation interface, $k_s$ is a permeability of the sand in the sand-formation interface, and $r_0$ is a radius of the conduit; and attaching a shroud to the base conduit or the screen.

7. The method of claim 6, further comprising:
fabricating the base conduit.

8. The method of claim 6, further comprising:
fabricating the screen.

9. The method of claim 6, further comprising:
fabricating the shroud.

10. The method of claim 6, further comprising attaching the screen to the base conduit such that the portion of the screen can be exposed to a fluid flowing through the portion into the at least one orifice.

* * * * *